US009429921B2

(12) United States Patent
Lu et al.

(10) Patent No.: US 9,429,921 B2
(45) Date of Patent: Aug. 30, 2016

(54) METHOD AND SYSTEM FOR ENERGY CONTROL MANAGEMENT

(71) Applicants: Yan Lu, West Windsor, NJ (US); Ling Shen, Cherry Hill, NJ (US); Jianmin Zhu, Piscataway, NJ (US)

(72) Inventors: Yan Lu, West Windsor, NJ (US); Ling Shen, Cherry Hill, NJ (US); Jianmin Zhu, Piscataway, NJ (US)

(73) Assignee: Siemens Aktiengesellschaft, Munich (DE)

( * ) Notice: Subject to any disclaimer, the term of this patent is extended or adjusted under 35 U.S.C. 154(b) by 381 days.

(21) Appl. No.: 14/115,888

(22) PCT Filed: Sep. 17, 2012

(86) PCT No.: PCT/US2012/055707
§ 371 (c)(1),
(2) Date: Nov. 6, 2013

(87) PCT Pub. No.: WO2013/040539
PCT Pub. Date: Mar. 21, 2013

(65) Prior Publication Data
US 2014/0074306 A1 Mar. 13, 2014

Related U.S. Application Data

(60) Provisional application No. 61/535,504, filed on Sep. 16, 2011.

(51) Int. Cl.
*G05B 13/04* (2006.01)
*G06F 17/50* (2006.01)
*G06N 3/12* (2006.01)
*G06Q 10/04* (2012.01)
*G06Q 50/06* (2012.01)

(52) U.S. Cl.
CPC ............ *G05B 13/04* (2013.01); *G06F 17/5009* (2013.01); *G06N 3/126* (2013.01); *G06Q 10/04* (2013.01); *G06Q 50/06* (2013.01)

(58) Field of Classification Search
CPC .. G05B 13/04; G06F 17/5009; G06Q 50/06; G06Q 10/04; G06N 3/126
See application file for complete search history.

(56) References Cited

U.S. PATENT DOCUMENTS

| 8,116,918 | B2 * | 2/2012 | Noureldin | F01K 13/02 60/206 |
| 8,397,204 | B2 * | 3/2013 | Sengupta | G06F 9/50 716/132 |
| 2004/0060776 | A1 * | 4/2004 | Tyni | B66B 1/2458 187/380 |

(Continued)

OTHER PUBLICATIONS

Li et al., "Forecasting building energy consumption with hybrid genetic algorithm-hierarchical adaptive network-based fuzzy inference system", Energy and Buildings, Lausanne, CH, vol. 42, No. 11, Nov. 1, 2010, pp. 2070-2076.
Cardenas et al., "Evolutive ANFIS training for energy load profile forecast for an IEMS in an automated factory", Emerging Technologies & Factory Automation, 2011 IEEE 16th Conf. on IEEE, Sep. 5, 2011, pp. 1-8.
International Search Report dated Jan. 17, 2013.

*Primary Examiner* — Ramesh Patel (57) ABSTRACT

In order to reduce computation time and cost involved with determining one or more optimal parameters for a pre-cooling strategy, for a modeled system, a two-step genetic algorithms is used to optimize energy consumption of the modeled system with respect to cost of the energy consumption. A first step of the two-step genetic algorithms determines a population of potential solutions that are used to initialize a second step of the two-step genetic algorithm. The second step of the two-step genetic algorithm determines the one or more optimal parameters for the pre-cooling strategy from the population output by the first genetic algorithm.

19 Claims, 4 Drawing Sheets

(56) References Cited

U.S. PATENT DOCUMENTS

| | | | |
|---|---|---|---|
| 2007/0199336 A1* | 8/2007 | Tantot | F24F 11/006 62/157 |
| 2011/0054698 A1* | 3/2011 | Dempster | F24F 11/0009 700/276 |
| 2013/0024029 A1* | 1/2013 | Tran | A61B 5/1113 700/278 |
| 2013/0048114 A1* | 2/2013 | Rothman | F24D 19/1012 137/551 |
| 2013/0190940 A1* | 7/2013 | Sloop | G05B 15/02 700/291 |

* cited by examiner

METHOD AND SYSTEM FOR ENERGY CONTROL MANAGEMENT

RELATED APPLICATIONS

The present patent document claims the benefit of the filing date under 35 U.S.C. §119(e) of Provisional U.S. Patent Application Ser. No. 61/535,504, filed Sep. 16, 2011, which is hereby incorporated by reference.

FIELD

The present embodiments relate to optimization in energy control management.

BACKGROUND

During peak demand periods in a day, customers of an electrical utility company may require electrical power at a higher than average supply level. The peak demand periods may last for a number of hours one or more times during the day, may vary with each season of the year, and may vary from region to region. For example, in the summer months, a peak demand period may be between 2:00 PM and 6:00 PM, representing the time when air conditioners are turned on in anticipation of the customers of the electrical utility company returning from work. In the winter months in the northern states of the Untied States, for example, peak demand periods may be between 6:00 AM and 9:00 AM and 2:00 PM and 6:00 PM, respectively representing the times when the heater is turned on in anticipation of the customers of the electrical utility company waking up for work and returning from work. In order to incentivize energy conservation during the peak demand periods, the electrical utility company may increase the cost of energy consumption during the peak demand periods.

An energy consumption strategy (e.g., the pre-cooling strategy) for buildings has been developed with this increase in cost of energy consumption in mind. With the pre-cooling strategy, a whole building is pre-cooled during the non-peak demand period(s), so that a certain amount of thermal mass may be saved. The thermal mass may then be shaded by raising a cooling set point during the peak demand period(s). For example, a cooling period may be specified, and the temperature within the building may be shaded exponentially during the peak demand period(s).

Optimal values for start and end times for the cooling period and an end time for the exponential temperature increase of the pre-cooling strategy (e.g., pre-cooling times) may be determined using a numerical model to exhaustively simulate the cost of energy consumption for the possible combinations of the pre-cooling times. This, however, may result in high computation time and cost, as the number of possible combinations of the pre-cooling times may be high.

SUMMARY

In order to reduce computation time and cost involved with determining one or more optimal parameters for a pre-cooling strategy of a modeled system, a two-step genetic algorithm is used to optimize energy consumption of the modeled system with respect to the cost of the energy consumption. A first step of the two-step genetic algorithm determines a population of potential solutions that is used to initialize a second step of the two-step genetic algorithm. The second step determines the one or more optimal parameters for the pre-cooling strategy.

In a first aspect, a method for optimizing energy consumption in a system includes identifying a plurality of candidate solutions for one or more parameters related to the energy consumption in the system. The method also includes initializing a two-step genetic algorithm with a subset of the plurality of identified candidate solutions. A processor solves, using the two-step genetic algorithm, for an optimum energy consumption in the system with respect to a cost of the energy consumption in the system, and the one or more parameters related to the energy consumption in the system are determined based on the optimized energy consumption.

In a second aspect, a non-transitory computer-readable storage medium that stores instructions executable by one or more processor to optimize parameters for a pre-cooling strategy for a structure is provided. The instructions include initializing a first step of a two-step genetic algorithm of a model operable to simulate energy consumption of a system associated with a structure and one or more temperatures in the structure over a period of time with a first population of candidate solutions. Each candidate solution of the first population of candidate solutions includes a combination of a start time and an end time of a cooling period of the pre-cooling strategy. A second population of candidate solutions is determined from the first population of candidate solutions with the first step of the two-step genetic algorithm. The instructions include initializing a second step of the two-step genetic algorithm with the second population of candidate solutions, and optimizing the energy consumption in the structure over the period of time with respect to a cost of the energy consumption in the structure and a variable representing an uncomfortableness of an occupant of the structure over the period of time. An optimized start time and end time of the cooling period of the pre-cooling strategy corresponds to the optimized energy consumption.

In a third aspect, a system for optimizing energy consumption in a thermodynamics system associated with a structure includes an input operable to receive data for a plurality of candidate solutions for one or more parameters related to the energy consumption in the thermodynamics system. The system also includes a processor operatively connected to the input. The processor is configured to input a first population of candidate solutions of the plurality of candidate solutions to a first step of a two-step genetic algorithm, and determine a second population of candidate solutions of the plurality of candidate solutions with the first step of the two-step genetic algorithm. The processor is also configured to input the second population of candidate solutions to a second step of the two-step genetic algorithm. The processor is configured to optimize, with the second step of the two-step genetic algorithm, the energy consumption in the structure with respect to a cost of the energy consumption in the thermodynamics system and a variable representing an uncomfortableness of an occupant of the structure. The processor is configured to determine the one or more parameters related to the energy consumption in the thermodynamics system based on the optimized energy consumption.

The present invention is defined by the following claims, and nothing in this section should be taken as a limitation on the claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the FIG. 1 shows a flowchart of one embodiment of a method for optimizing energy consumption.

DETAILED DESCRIPTION OF THE DRAWINGS

An energy control management system may be applied to manage building energy usage so that maximal energy peak load savings and maximal user comfortableness may be achieved. The energy control management system uses one or more genetic algorithms to react to incoming weather data, demand response events, and human being requirements.

An energy simulation may be implemented, such as using the EnergyPlus tool with MLE+ simulation framework, so that real-time energy results may be simulated by inputting runtime building data and control information (e.g., temperature set points, zoning, and fan speed). The one or more genetic algorithms may use the energy results from the energy simulation to determine optimal parameters for the management of the building energy usage. Using a search heuristic that emulated evolution, the energy simulation may be used to evolve a solution.

Figure 1:
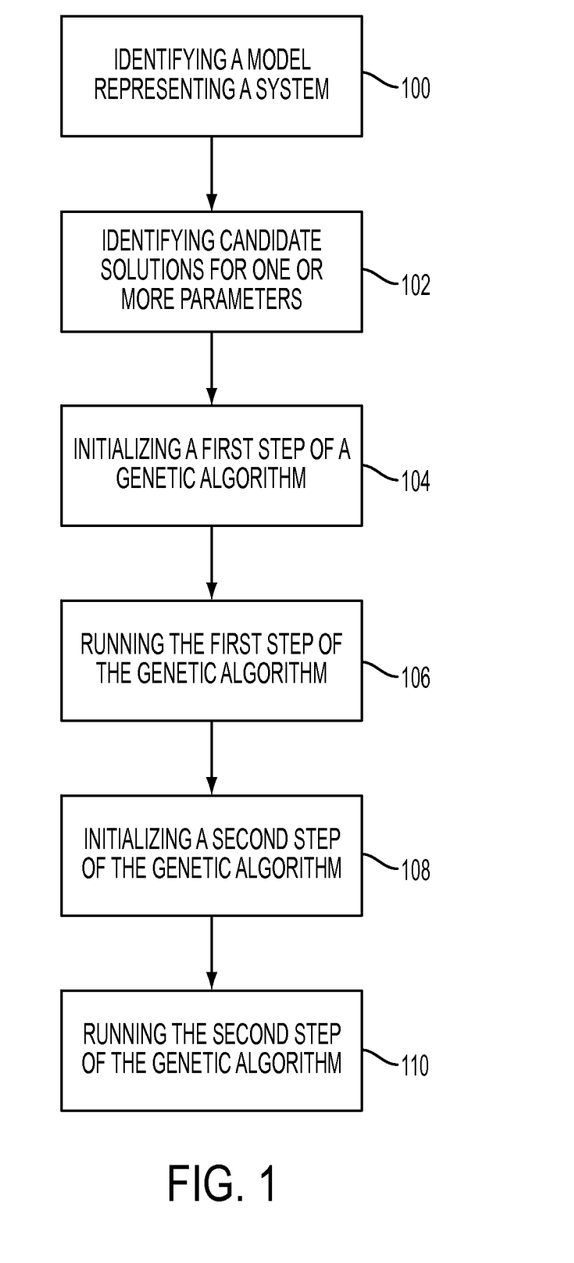

FIG. 1 shows a flowchart of one embodiment of a method for optimizing energy consumption in a system. The method may be performed using the system shown in FIG. 5 or another system. The method is implemented in the order shown, but other orders may be used. Additional, different, or fewer acts may be provided. Similar methods may be used for optimizing energy consumption in a system.

In act 100, a model operable to simulate energy consumption of a system (e.g., a building) is identified. The building may include a heating, ventilation, and air conditioning (HVAC) system and other systems, and the model may be operable to simulate the energy consumption of the HVAC system and the other systems.

Figure 2:
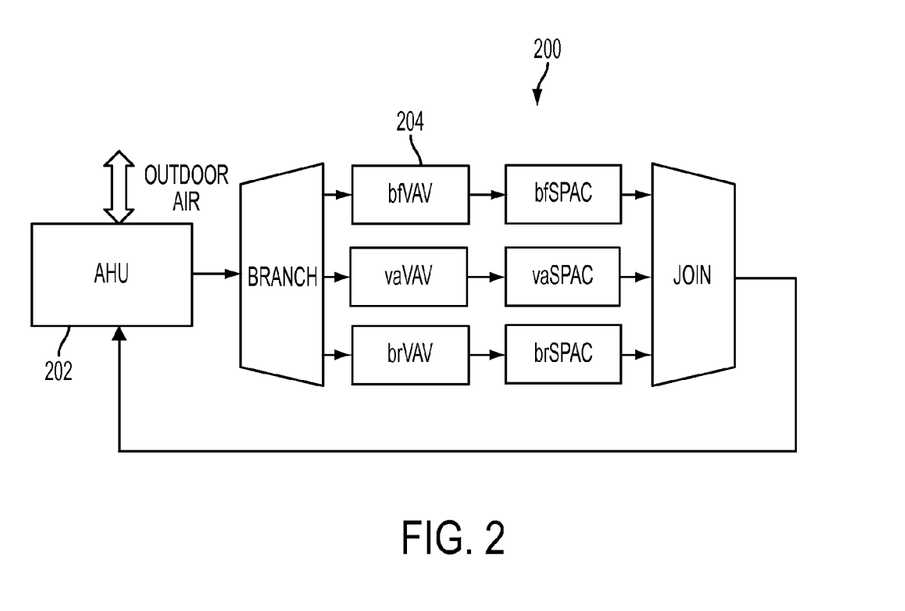
FIG. 2 shows a layout of an example heating, ventilation, and air conditioning (HVAC) system.

FIG. 2 shows a layout of an example heating, ventilation, and air conditioning (HVAC) system 200 that may be used in the building. The building may, for example, be a one-floor small building with three zones (e.g., a first zone bf, a second zone va, and a third zone br). Hot or cold air is supplied by an air handling unit (AHU) 202 to the first zone bf, the second zone va, and the third zone br. Each of the first zone bf, the second zone va, and the third zone br includes a hot water reheat variable air volume (VAV) box 204. A space in each of the first zone bf, the second zone va, and the third zone br (e.g., a first space bfSpace, a second space vaSpace, and a third space brSpace) is equipped with a thermostat for the control of the room temperature. An air supply temperature of the AHU 202 is set based on the outdoor temperature. The AHU 202 includes an economizer (e.g., a mixing box), and a controller of the AHU 202 has four modes: mode 1—minimum outdoor air and heating with a heating coil; mode 2—cooling with outdoor air only; mode 3—cooling with maximum outdoor air and a cooling coil; and mode 4—cooling with minimum outdoor air and a cooling coil. Other modes may be used. In other embodiments, the HVAC system 200 may include additional, fewer, or different components. The HVAC system 200 may be used in a larger or smaller building with more or fewer zones.

The model may be received at an input of a computing system, may be retrieved from a memory of the computing system, or may be generated by a processor of the computing system. In one embodiment, a building information model (BIM) may be identified by the processor of the computing system. The BIM is a digital representation of physical and functional characteristics of the building, for example. A user at the computing device, for example, may select modules (e.g., nodes) that numerically represent components of the HVAC system and the other systems within the building, for example, from a library of modules stored in the memory or another memory and arrange the modules within a graphical user interface (GUI) at the computing device to represent the building. The user may also be able to connect the nodes within the GUI, such that data may be passed between the different connected nodes.

The components may include, for example, valves, coils (e.g., heating coils and cooling coils), fans, variable air volumes (VAVs), and air handling units (AHUs). The plurality of nodes are connected to each other via arcs or edges that correspond to mass flow connections such as, for example, ducts, pipes, or electrical energy flows in power lines. The arcs or edges may pass data to nodes upstream and downstream of a node.

In one embodiment, the model is generated within the EnergyPlus Energy Simulation Software developed by the Department of Energy (DOE). EnergyPlus is a whole building energy analysis and thermal load simulation program that models heating, cooling, lighting, ventilation, and other energy flows. Based on the BIM imported into or generated within EnergyPlus, EnergyPlus calculates heating and cooling loads to maintain thermal control setpoints (e.g., thermal control setpoints for each zone of the BIM), the energy consumption of the components that make up the HVAC system and the other systems of the building (e.g., total energy consumption), and temperatures within the building (e.g., within different zones of the building). Other modeling and/or simulation software may be used. A run period (e.g., August 1st to August 31st) may be specified for the generated model.

The model identified in act 100 may simulate the energy consumption of the building using the pre-cooling strategy or other cooling strategies. With the pre-cooling strategy, more energy is consumed when energy is cheaper, and less energy is consumed when energy is more expensive (e.g., during the peak demand period(s)). In other words, the goal of the pre-cooling strategy is to pre-cool the building during the non-peak demand period(s), so that a certain amount of thermal mass may be saved. Different pre-cooling strategies, however, may be applied, with a number of cooling period start times, cooling period end times, and exponential temperature increase end times being possible. The optimal pre-cooling strategy depends on, for example, the weather pattern outside of the building (e.g., depending on the location of the building and/or the time of year) and/or the peak demand period(s).

Figure 3:
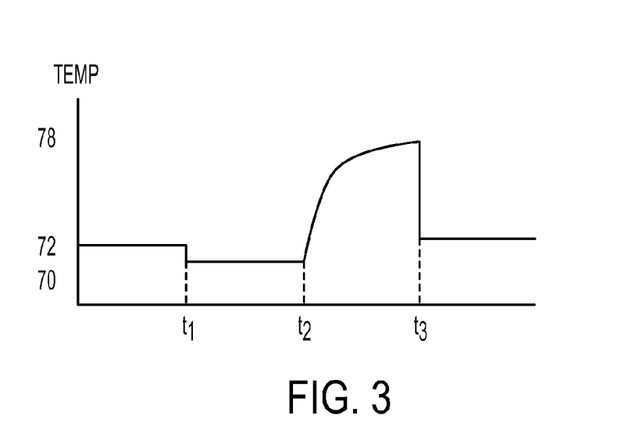
FIG. 3 shows an exemplary plot of temperature vs. time for the pre-cooling strategy.

FIG. 3 shows an exemplary plot of temperature vs. time for the pre-cooling strategy over the course of a single day. With the comfortableness of occupants of the building in mind, a temperature (e.g., inside the building; a first temperature) before a cooling period (e.g., cooling period between $t_1$ and $t_2$) may, for example, be set to 72° F., a temperature (e.g., a second temperature) during the cooling period may, for example, be set to 71° F., and a temperature (e.g., a third temperature) after a temperature increase (e.g., an exponential temperature increase after the cooling period; after $t_3$) may, for example, be set to 73° F. More, fewer, and/or different temperatures may be set. The first temperature, the second temperature, and/or the third temperature may be set to other temperatures. The first temperature, the second temperature, the third temperature, $t_1$, $t_2$, and $t_3$ may be set as the thermal control setpoints within the model identified in act 100.

The optimization of the energy consumption may determine optimal values for $t_1$, $t_2$, and $t_3$, such that cost for the energy consumption (e.g., eCost) is minimized, and a variable representing uncomfortableness of occupants of the building (e.g., uncft) is minimized over the specified time period (e.g., one day during August; the entire month of August). eCost may, for example, be a total amount of energy cost for the building (e.g., the HVAC system) during the specified time period with a specified weather pattern. uncft may, for example, be a total amount of uncomfortableness during the specified time period with the specified weather pattern. eCost and uncft may be derived from the total energy consumption and the temperature values within the building calculated by the model identified in act 100. For example, eCost may be calculated by using a first price policy (e.g., $0.10/jar) during non-peak time and a second price policy (e.g., $1.10/jar) during peak time. uncft may be calculated using any number of measurement systems. For example, uncft may be calculated with:

$$uncft(T) = \begin{cases} 100, & \text{if } T < 65 \text{ or } T > 60 \\ 70 - T, & \text{if } T \leq 70 \\ \frac{1}{2} * (T - 70), & \text{otherwise} \end{cases},$$

where a total amount of uncomfortableness is defined as a summation of total uncomfortableness for each thermal zone within the BIN. Other measurement systems for uncft may be used.

In act 102, a plurality of candidate solutions for one or more parameters related to the energy consumption in the building is identified. Identifying the plurality of candidate solutions may include receiving ranges for the one or more parameters or the plurality of candidate solutions at an input of the computing system or retrieving the plurality of candidate solutions from a memory of the computing system. The one or more parameters may include a start time of the cooling period (e.g., $t_1$), an end time of the cooling period (e.g., $t_2$), and an end time of the exponential temperature increase (e.g., $t_3$). The one or more parameters may include more, fewer, and/or different parameters related to the energy consumption in the building. For example, the one or more parameters may include the first temperature, the second temperature, and/or the third temperature.

An electrical utility company servicing the building may charge more for energy consumption during the peak demand period (e.g., between the hours of 2:00 PM and 6:00 PM). Ranges for the one or more parameters (e.g., $t_1$, $t_2$, and $t_3$) may be set based on the peak demand period. For example, the ranges may be input as follows:

$$D=\{(t1,t2,t3): 5<=t1<=10; t1<t2<=13; 17<=t3<=19\},$$

where t1, t2, and t3 are integers that represent the hours in a single day. D belongs to R3, which contains, for example, ninety-nine candidate solutions for each weather pattern (e.g., ninety-nine different combinations of t1, t2, and t3). In other embodiments, the ranges may be larger, smaller, more, and/or fewer, and t1, t2, and/or t3 may or may not be integers.

Figure 4:
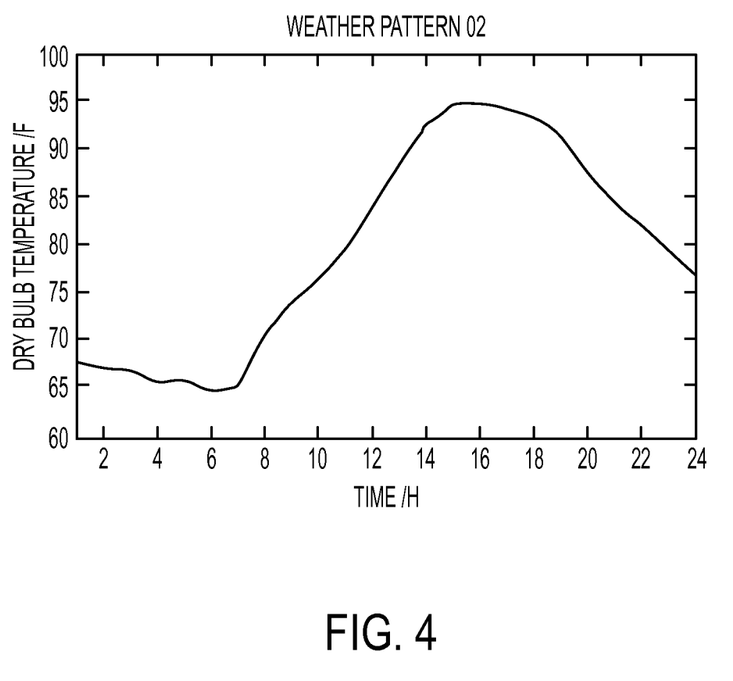
FIG. 4 shows an exemplary weather pattern.

A plurality of representative weather patterns may be identified (e.g., nineteen weather patterns). The plurality of representative weather patterns may, for example, represent the most likely weather patterns in a city or state, in which the building is located. FIG. 4 shows an exemplary weather pattern (e.g., Weather Pattern 02) representative of a likely weather pattern in August in the northern United States. Prior to optimization, the model identified in act 100 may be run (e.g., representing the specified time period) for each representative weather pattern of the plurality of weather patterns, for each of the ninety-nine candidate solutions, for example. This may be done once prior to use of the method for optimizing energy consumption in the system using real-time temperature data (e.g., projected temperature data for a single day). The model identified in act 100 may determine the total energy consumption over the specified time period and thus may calculate total values for eCost and uncft (e.g., representative of all the thermal zones in the BIM) for each of the ninety-nine candidate solutions and weather patterns. In other words, for the ninety-nine iterations of the simulation of the model identified in act 100, ninety-nine values of eCost and ninety-nine values of uncft are calculated. A minimum energy cost $eCost_{min}$ and a maximum energy cost $eCost_{max}$ and a minimum measure of uncomfortableness $uncft_{min}$ and a maximum measure of uncomfortableness $uncft_{max}$ may be determined for each representative weather pattern of the plurality of representative weather patterns.

In act 104, an optimization algorithm is initialized with a first population of candidate solutions of the plurality of candidate solutions identified in act 102. The optimization algorithm may be a two-step optimization algorithm, and a first step of the two-step algorithm may be initialized in act 104. In another embodiment, the optimization may be a first optimization algorithm. The optimization algorithm may be used, for example, to optimize an object function F, where F is represented by:

$$F(eCost, uncft) = \frac{(eCost - eCost_{min})}{\max(eCost - eCost_{min})} + \frac{(uncft - uncft_{min})}{\max(uncft - uncft_{min})}$$

In other embodiments, the differences on the right side of the equation may not be normalized. Other object functions may be used. The optimization problem P to be solved by the optimization algorithm is thus:

$$(P)=\text{Minimize } F(eCost, uncft)\text{–for all set points in } D$$

The optimization problem P is discrete (e.g., with ninety-nine integer set points in the domain D), and every evaluation of the object function F requires one energy simulation using the model identified in act 100. The object function is very oscillated (e.g., frequently changing values with a steep change), and the optimization problem P is a global optimization problem.

For this global optimization problem, a global optimization algorithm may be used to find a global optimum. The global optimization algorithm may require a reasonable amount of computation to find an accurate global optimum. The optimization algorithm may, for example, be a genetic algorithm. Other optimization algorithms may be used.

To fit the optimization model to the genetic algorithm framework, the original optimization model may be modified so that the optimization model is essentially a continuous problem. Using $$D_r=[5,10]\times[5,13]\times[17,19], \text{ where } t=[t_1,t_2,t_3]\in D_r,$$

an essentially continuous objective function eNorm is defined as:

$$eNorm(t) = \begin{cases} F(eCost, uncft) & \text{if } t \in D \\ F(eCost', uncft') & \text{if } t \in D_r \text{ and } t' \in D \\ 100.0 & \text{otherwise} \end{cases}$$

When t is in D, the value of F(t) is used. When t is in $D_r$ but not in D, t' is determined. t' is calculated by:

$$t'=[\text{int}(t1),\text{int}(t2),\text{int}(t3)],$$

where int(t) takes the integer part of t. int(t) will round up if the decimal part of t is greater than or equal to 0.5 and will round off if the decimal part of t is less than 0.5. If t' is in D, eCost' and uncft' denote values from the energy simulation using the model identified in act 100 of t', and F(t') is used as the value of eNorm(t). For all other cases, 100.0, for example, is used as the value of eNorm(t). Although this extends the objective function from discrete to continuous with a 3D cube domain $D_r$, no extra evaluation is imposed, and the global optimum may remain the same. Other definitions for eNorm may be used, or the original optimization model may not be modified.

The genetic algorithm is a search heuristic that mimics the process of natural evolution. The genetic algorithm generates solutions to optimization problems using techniques such as, for example, inheritance, mutation, selection, and crossover (e.g., inspired by natural evolution). A population of candidate solutions to an optimization problem (e.g., combinations of t1, t2, and t3) is evolved toward better solutions.

MATLAB, for example, includes a genetic algorithm solver within the Math Works Optimization Tool. The Math Works Optimization Tool allows the user at the computing device to specify different parameters for optimization problem P, for example. Three different types of options that may be specified include, for example, the global optimization algorithm solver (e.g., the genetic algorithm), the fitness function (e.g., eNorm(t)), and options during the process of solver iterations. Options that may be specified may include, for example, the number of variables (e.g. 3—t1, t2, and t3), lower bounds (e.g., [5, 5, 17]), upper bounds (e.g., [10, 13, 19]), the populating type (e.g., double vector), the population size (e.g., 30 or 40), the creation function (e.g., constraint dependent), the fitness scaling (e.g., rank), the selection function (e.g., uniform), the elite count (e.g., 6), the mutation function (e.g., adaptive feasible), and the crossover function (e.g., heuristic). More, fewer, and/or different options may be specified by the user at the computing device. Other software programs may be used to apply the genetic algorithm to the optimization problem P.

The first population of candidate solutions may be randomly selected from the identified plurality of candidate solutions (e.g., ninety-nine candidate solutions). For example, the computing device may randomly select the first population from the identified plurality of candidate solutions. The number of candidate solutions in the first population may be set based on the specified options in the Math Works Optimization Tool. In one embodiment, the user may select some or all of the first population at the computing device.

In act 106, the first step of the genetic algorithm is run to determine a second population of candidate solutions of the plurality of identified candidate solutions. The first step of the genetic algorithm may be run coarsely. In other words, stop-criterions for terminating the running of the first step of the genetic algorithm may be loose. With loose stop-criterions, a number of candidate solutions of the first population may satisfy the stop-criterions. In one embodiment, the objective function F may be further simplified such that the computation time for running the first genetic algorithm is further reduced. One goal for running the first genetic algorithm may be to export a population with good "genes" (e.g., the second population).

In act 108, a second step of the genetic algorithm is initialized with the second population of candidate solutions determined in act 106. The running of the first step of the genetic algorithm in act 106 may, for example, return a number of candidate solutions of the first population that have good "genes." If the first step of the genetic algorithm returns fewer candidate solutions than the specified population size, the computing device may automatically define the remaining candidate solutions. Alternatively, the user may define the remaining candidate solutions at the computing device. The options for the second step of the genetic algorithm within the Math Works Optimization Tool may be defined the same as, similarly to, or differently than for the first genetic algorithm. An increased number of candidate solutions in the second population may increase the computation time but may also increase the accuracy of the optimization. In one embodiment, the second step is a second genetic algorithm.

In act 110, the second step of the genetic algorithm is run to optimize the energy consumption in the building. One or more finer termination criterions may be defined such that a global optimum is determined for the optimization problem P. The global optimum may represent optimal values for t1, t2, and t3, such that a combination of eCost and uncft is minimized.

In one embodiment, the first step of the genetic algorithm is not used to determine the second population of candidate solutions. Instead, the second step of the genetic algorithm is initialized randomly with candidate solutions of the plurality of candidate solutions. In another embodiment, the second step of the genetic algorithm may not be initialized at all. If the initial population of the second step of the genetic algorithm is not defined, however, the computation time may increase, and the accuracy of the optimization may decrease.

The method for optimizing energy consumption in the system may be used in real-time (e.g., on the same day that the HVAC system of the building is to be controlled) to calculate optimal values for t1, t2, and t3, for example. In one embodiment, the first step of the genetic algorithm may be run for each of the nineteen representative weather patterns, for example, to determine the second populations of candidate solutions for the nineteen representative weather patters. The second populations may be stored in the memory of the computing system or another storage device. For real-time use of the energy control management system, a projected weather pattern for the current day may be compared to the nineteen representative weather patterns. One representative weather pattern of the nineteen representative weather patterns may be selected based on the comparison, and the stored second population corresponding to the one representative weather pattern may be selected for use in act 108. In another embodiment, a single weather pattern is defined and used in the first step of the two-step genetic algorithm to determine a second population to be used for all real time weather patterns (e.g., the projected weather pattern for the current day). In other words, the first step of the two-step genetic algorithm is run with the single weather pattern to determine a group of candidates that are to be used as an initial population for all other energy optimization problems.

The calculated optimal values for t1, t2, and t3 may be forwarded to a controller of the HVAC system and may be used by the controller to design and set the pre-cooling strategy for the building for the day. The method provides a building energy control intelligent management system that quickly reacts to incoming weather data and demand response events, such that approximately 30% peak load savings may be achieved, and relative comfortableness may be maintained. The computation time for the optimization may also be decreased compared to the prior art using the building energy control intelligent management system.

Figure 5:
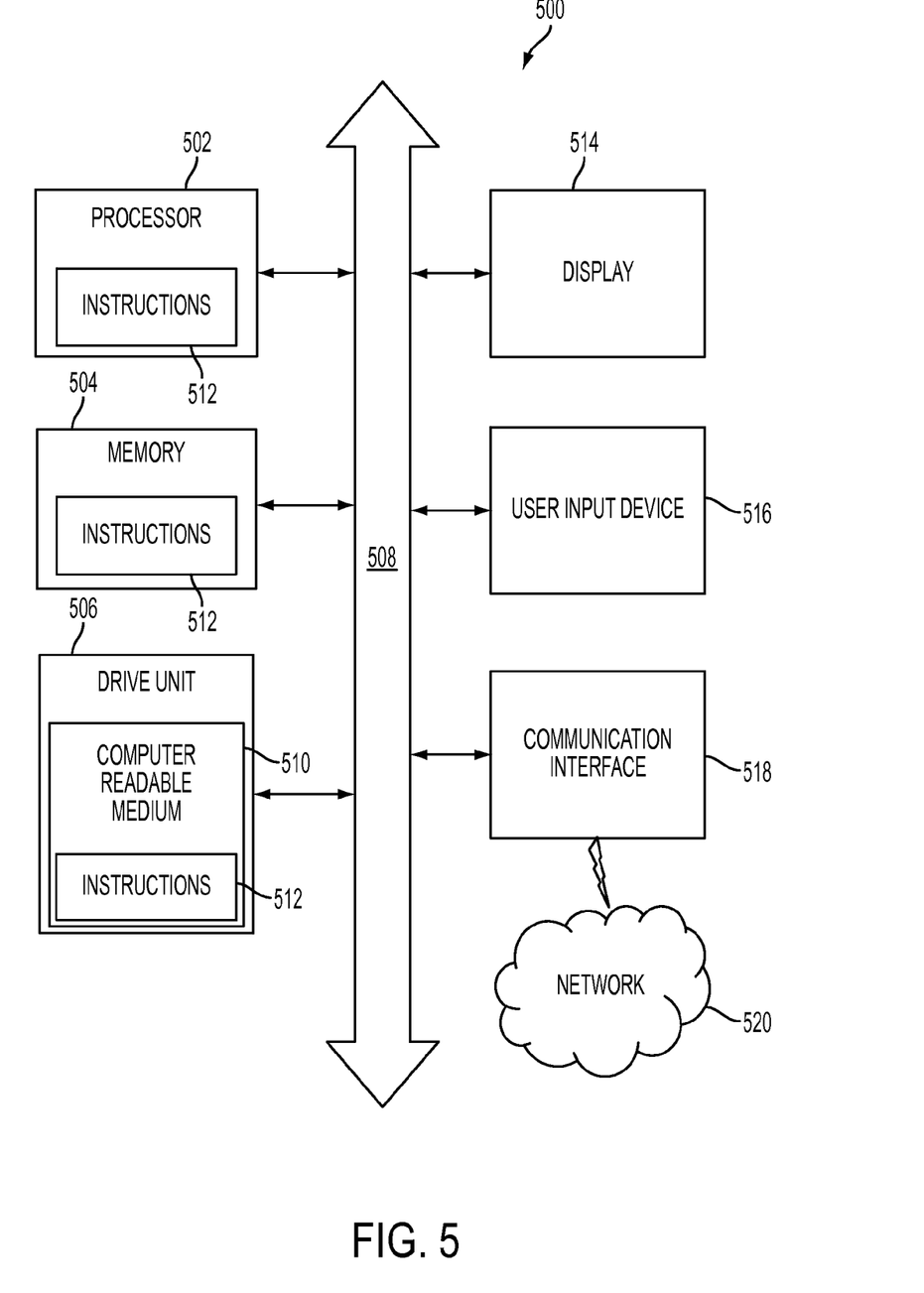
FIG. 5 shows one embodiment of a computer system used for fault detection and diagnosis (FDD).

FIG. 5 shows an illustrative embodiment of a general computer system 500. The computer system 500 may include a set of instructions that may be executed to cause the computer system 500 to perform any one or more of the methods or computer based functions disclosed herein. The computer system 500 may operate as a standalone device or may be connected to other computer systems or peripheral devices. Any of the components discussed above (e.g., the computing device) may be a computer system 500 or a component in the computer system 500.

In a networked deployment, the computer system 500 may operate in the capacity of a server or as a client user computer in a client-server user network environment, or as a peer computer system in a peer-to-peer (or distributed) network environment. The computer system 500 may also be implemented as or incorporated into various devices, such as a programmable logic controller, a panel, an engineering station, an operator station, a personal computer (PC), a tablet PC, a set-top box (STB), a personal digital assistant (PDA), a mobile device, a palmtop computer, a laptop computer, a desktop computer, a communications device, a wireless telephone, a control system, a personal trusted device, a web appliance, or any other machine capable of executing a set of instructions (sequential or otherwise) that specify actions to be taken by that machine. In one embodiment, the computer system 500 may be implemented using electronic devices that provide voice, video or data communication. Further, while a single computer system 500 is illustrated, the term "system" shall also be taken to include any collection of systems or sub-systems that individually or jointly execute a set, or multiple sets, of instructions to perform one or more computer functions.

As illustrated in FIG. 5, the computer system 500 may include a processor 502 (e.g., a central processing unit (CPU)), a graphics processing unit (GPU), or both. The processor 502 may be a component in a variety of systems. For example, the processor 502 may be part of a standard personal computer or a workstation. The processor 502 may be one or more general processors, digital signal processors, application specific integrated circuits, field programmable gate arrays, servers, networks, digital circuits, analog circuits, combinations thereof, or other now known or later developed devices for analyzing and processing data. The processor 502 may implement a software program, such as code generated manually (i.e., programmed).

The computer system 500 may include a memory 504 that may communicate via a bus 508. The memory 504 may be a main memory, a static memory, or a dynamic memory. The memory 504 may include but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one embodiment, the memory 504 includes a cache or random access memory for the processor 502. In alternative embodiments, the memory 504 is separate from the processor 502, such as a cache memory of a processor, the system memory, or other memory. The memory 504 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 504 is operable to store instructions executable by the processor 502. The functions, acts or tasks illustrated in the figures or described herein may be performed by the programmed processor 502 executing the instructions stored in the memory 504. The functions, acts or tasks are independent of the particular type of instructions set, storage media, processor or processing strategy and may be performed by software, hardware, integrated circuits, firmware, microcode and the like, operating alone or in combination. Likewise, processing strategies may include multiprocessing, multitasking, parallel processing and the like.

As shown, the computer system 500 may further include a display unit 514, such as a liquid crystal display (LCD), an organic light emitting diode (OLED), a flat panel display, a solid state display, a cathode ray tube (CRT), a projector, a printer or other now known or later developed display device for outputting determined information. The display 514 may act as an interface for the user to see the functioning of the processor 502, or specifically as an interface with the software stored in the memory 504 or in a disk or optical drive unit 506 (e.g., a disk drive unit).

Additionally, the computer system 500 may include an input device 516 configured to allow a user to interact with any of the components of system 500. The input device 516 may be a number pad, a keyboard, or a cursor control device, such as a mouse, or a joystick, touch screen display, remote control or any other device operative to interact with the system 500.

In one embodiment, as depicted in FIG. 5, the computer system 500 may also include the disk or optical drive unit 506. The disk drive unit 506 may include a computer-readable medium 510, in which one or more sets of instructions 512 (e.g., software) may be embedded. Further, the instructions 512 may embody one or more of the methods or logic as described herein. In one embodiment, the instructions 512 may reside completely, or at least partially, within the memory 504 and/or within the processor 502 during execution by the computer system 500. The memory 504 and the processor 502 also may include computer-readable media as discussed above.

The present disclosure contemplates a non-transitory computer-readable medium that includes instructions 512 or receives and executes instructions 512 responsive to a propagated signal, so that a device connected to a network 520 may communicate voice, video, audio, images or any other data over the network 520. Further, the instructions 512 may be transmitted or received over the network 520 via a communication port 518. The communication port 518 may be a part of the processor 502 or may be a separate component. The communication port 518 may be created in software or may be a physical connection in hardware. The communication port 518 is configured to connect with the network 520 or another network, external media, the display 514, any other components in system 500, or combinations thereof. The connection with the network 520 may be a physical connection, such as a wired Ethernet connection or may be established wirelessly as discussed below. Likewise, the additional connections with other components of the system 500 may be physical connections or may be established wirelessly.

The network 520 may include wired networks, wireless networks, or combinations thereof. The wireless network may be a cellular telephone network, an 802.11, 802.16, 802.20, or WiMax network. Further, the network 520 may be a public network, such as the Internet, a private network, such as an intranet, or combinations thereof, and may utilize a variety of networking protocols now available or later developed including, but not limited to TCP/IP based networking protocols.

While the computer-readable medium is shown to be a single medium, the term "computer-readable medium" includes a single medium or multiple media (e.g., a centralized or distributed database and/or associated caches and servers that store one or more sets of instructions). The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random access memory or other volatile re-writable memory. Additionally, the computer-readable medium may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In one embodiment, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limiting embodiment, implementations may include distributed processing, component/object distributed processing, and parallel processing. Alternatively, virtual computer system processing may be constructed to implement one or more of the methods or functionality as described herein.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for optimizing energy consumption in a system, the method comprising:
   identifying, by a processor, a plurality of candidate solutions for including one or more parameters of the system related to the energy consumption in the system;
   initializing, by the processor, a two-step genetic algorithm with at least one population of the plurality of identified candidate solutions;
   determining, by the processor utilizing the two-step genetic algorithm, an optimum energy consumption based on a cost of the energy for the system; and
   determining, by the processor, at least one parameter of the one or more parameters of the system based on the optimum energy consumption.

2. The method of claim 1, wherein the at least one population of the plurality of identified candidate solutions includes a range of thirty to forty candidate solutions.

3. The method of claim 1, wherein the at least one population includes a first population of candidate solutions and a second population of candidate solutions; the initializing the two-step genetic algorithm further comprising:
   determining, by the processor, a first step of the two-step genetic algorithm utilizing the first population of candidate solutions to determine the second population of candidate solutions, and
   determining, by the processor, a second step of the two-step genetic algorithm,
   wherein a termination criterion of the second step of the two-step genetic algorithm is finer than a termination criterion of the first step of the two-step genetic algorithm.

4. The method of claim 1, wherein the at least one population of candidate solutions are randomly selected.

5. The method of claim 1, further comprising outputting the one or more determined parameters to a controller operable to control the system.

6. The method of claim 1, wherein identifying the plurality of candidate solutions for the one or more parameters further comprises identifying a start time and an end time for a pre-cooling cooling period.

7. The method of claim 1 wherein identifying the plurality of candidate solutions for the one or more parameters further comprises identifying an end time for an exponential temperature increase period.

8. The method of claim 1, wherein determining the optimum energy consumption is further based on a variable representing an uncomfortableness of an occupant of a structure, in which the system is installed.

9. In a non-transitory computer-readable storage medium that stores instructions executable by one or more processors to optimize parameters for a pre-cooling strategy for a structure, the instructions comprising:

initializing a first step of a two-step genetic algorithm of a model operable to simulate energy consumption of a system associated with a structure and one or more temperatures in the structure over a period of time with a first population of candidate solutions, each candidate solution of the first population of candidate solutions including a combination of a start time and an end time of a cooling period;

determining a second population of candidate solutions from the first population of the candidate solutions utilizing the first step of the two-step genetic algorithm;

initializing a second step of the two-step genetic algorithm utilizing the second population of candidate solutions;

determining an optimum energy consumption in the structure over the period of time based on a cost of the energy consumption and a variable representing an uncomfortableness of an occupant of the structure utilizing the second step of the genetic algorithm, wherein an optimized start time and end time of the cooling period corresponds to the optimum energy consumption.

10. The non-transitory computer-readable storage medium of claim 9, further comprising identifying a plurality of candidate solutions, wherein initializing the first step of the two-step genetic algorithm comprises randomly selecting the first population of candidate solutions from the plurality of identified candidate solutions.

11. The non-transitory computer-readable storage medium of claim 10, wherein identifying the plurality of candidate solutions comprises identifying a plurality of candidate solutions comprising a combination of the start time and the end time of the cooling period and an end time of an exponential temperature increase period of the pre-cooling strategy, an optimized end time of the exponential temperature increase period of the pre-cooling strategy corresponding to the optimum energy consumption.

12. The non-transitory computer-readable storage medium of claim 10, wherein the second population of candidate solutions includes a range of thirty to forty candidate solutions.

13. The non-transitory computer-readable storage medium of claim 9, wherein optimizing the energy consumption in the structure comprises running the second step of the two-step genetic algorithm with a termination criterion that is finer than a termination criterion of the first step of the genetic algorithm.

14. The non-transitory computer-readable storage medium of claim 9, wherein determining an optimum energy consumption comprises simulating the energy consumption of the system and the one or more temperatures over the period of time once using the model for each iteration of the two-step genetic algorithm.

15. The non-transitory computer-readable storage medium of claim 14, wherein the instructions further comprise identifying a weather pattern for a region, in which the structure is located, as an input to the model.

16. The non-transitory computer-readable storage medium of claim 9, wherein the instructions further comprise controlling the system associated with the structure using the optimized start time and end time of the cooling period of the pre-cooling strategy.

17. A system for optimizing energy consumption in a thermodynamics system associated with a structure, the system comprising:

a memory, wherein the memory is configured to store computer readable instructions;

an input device operable to receive data for a plurality of candidate solutions for one or more parameters related to the energy consumption in the thermodynamics system; and a processor operatively connected to the input device and memory, the processor configured to execute the computer readable instructions, wherein the computer readable instructions are programmed to:

input a first population of candidate solutions of the plurality of candidate solutions to a first step of a two-step genetic algorithm;

determine a second population of candidate solutions from the first plurality of candidate solutions utilizing the first step of the two-step genetic algorithm;

input the second population of candidate solutions to a second step of the two-step genetic algorithm;

optimize, with the second step of the two-step genetic algorithm, the energy consumption in the structure based on a cost of the energy and a variable representing an uncomfortableness of an occupant of the structure; and determine the one or more parameters of the thermodynamics system based on the optimized energy consumption.

18. The system of claim 17, wherein the thermodynamics system comprises a heating, ventilation, and air conditioning system.

19. The system of claim 17, wherein the structure is a building.

* * * * *